United States Patent
Yeh et al.

(10) Patent No.: US 8,404,591 B2
(45) Date of Patent: Mar. 26, 2013

(54) METHOD OF FABRICATING COMPLEMENTARY METAL-OXIDE-SEMICONDUCTOR (CMOS) DEVICE

(75) Inventors: Chiu-Hsien Yeh, Tainan (TW); Chan-Lon Yang, Taipei (TW); Chin-Cheng Chien, Tainan County (TW); Lien-Fa Hung, Tainan (TW); Yun-Cheng Kao, Taipei County (TW)

(73) Assignees: United Microelectronics Corporation, Hsinchu (TW); Lam Research Corporation, Fremont, CA (US)

( * ) Notice: Subject to any disclaimer, the term of this patent is extended or adjusted under 35 U.S.C. 154(b) by 0 days.

(21) Appl. No.: 13/482,044

(22) Filed: May 29, 2012

(65) Prior Publication Data
US 2012/0238065 A1    Sep. 20, 2012

Related U.S. Application Data

(63) Continuation of application No. 12/874,332, filed on Sep. 2, 2010, now Pat. No. 8,211,801.

(51) Int. Cl.
*H01L 21/461*    (2006.01)
*H01L 21/302*    (2006.01)

(52) U.S. Cl. .......................................... 438/689; 438/694
(58) Field of Classification Search .................. 438/689, 438/694
See application file for complete search history.

(56) References Cited

U.S. PATENT DOCUMENTS

| | | | |
|---|---|---|---|
| 5,498,768 A | 3/1996 | Nishitani et al. | |
| 6,291,361 B1 * | 9/2001 | Hsia et al. | 438/738 |
| 6,451,647 B1 * | 9/2002 | Yang et al. | 438/240 |
| 6,841,484 B2 | 1/2005 | Ying et al. | |
| 6,900,118 B2 * | 5/2005 | Tzou et al. | 438/624 |
| 7,012,027 B2 | 3/2006 | Perng et al. | |
| 2004/0007561 A1 | 1/2004 | Nallan et al. | |
| 2010/0068874 A1 * | 3/2010 | Chang | 438/584 |

* cited by examiner

*Primary Examiner* — Luan C Thai
(74) *Attorney, Agent, or Firm* — WPAT PC; Justin King

(57) ABSTRACT

A method of fabricating a MOS device comprises steps as follows: An interfacial layer, a high-k dielectric layer and a cover layer on a substrate are sequentially formed. Then an in-situ wet etching step is performed by sequentially using a first etching solution to etch the cover layer and using a second etching solution to etch the high-k dielectric layer and the interfacial layer until the substrate is exposed, wherein the second etching solution is a mixed etching solution containing the first etching solution.

20 Claims, 12 Drawing Sheets

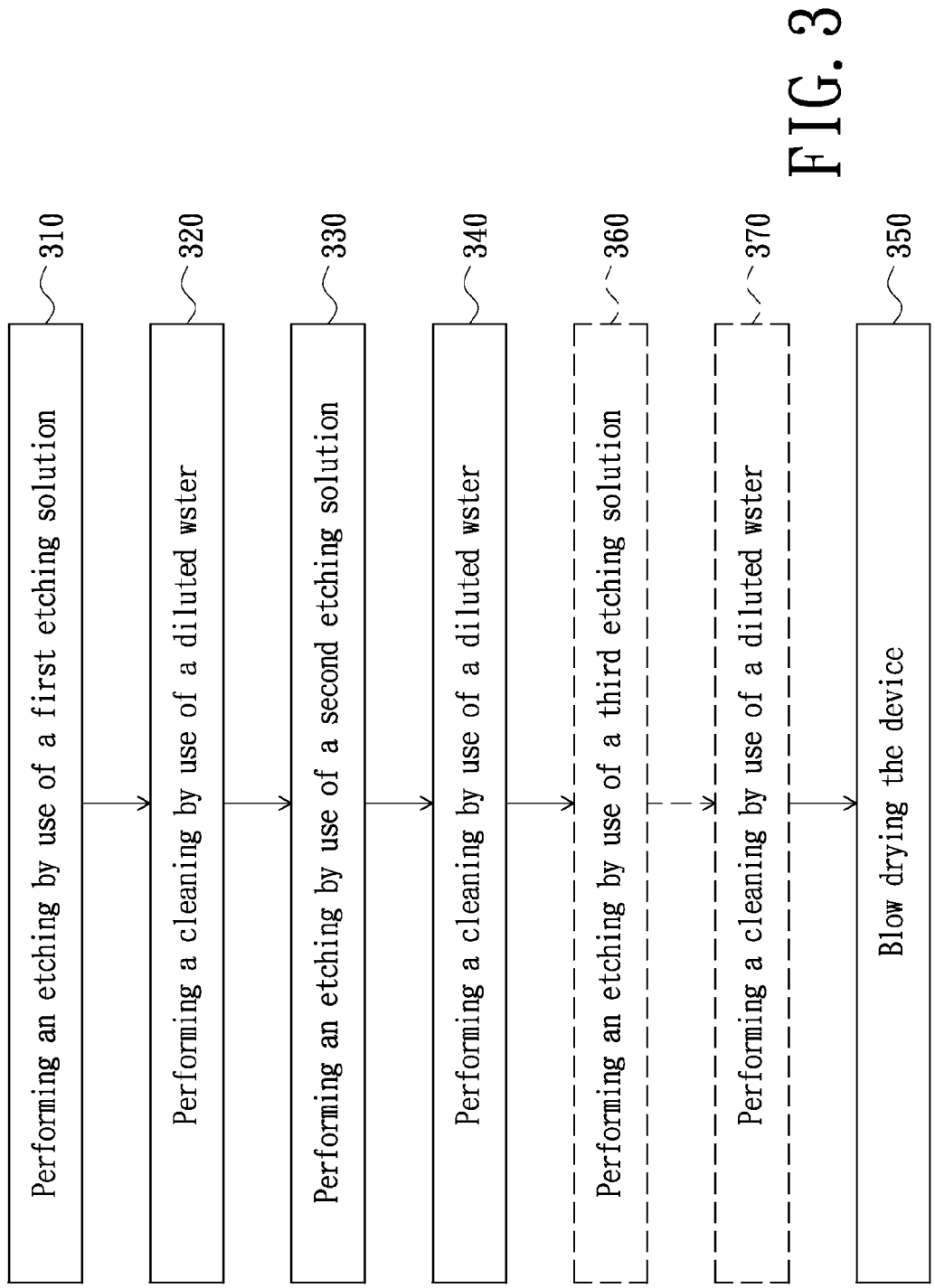

METHOD OF FABRICATING COMPLEMENTARY METAL-OXIDE-SEMICONDUCTOR (CMOS) DEVICE

CROSS-REFERENCE TO RELATED APPLICATION

This application is a continuation application of an application Ser. No. 12/874,332, filed on Sep. 2, 2010, and now pending. The disclosure presented in the continuation is the same as that of the above-mentioned patent application and the entirety of each of the above-mentioned patent applications is hereby incorporated by reference herein and made a part of this specification.

BACKGROUND

1. Technical Field

The present invention generally relates to methods of fabricating complementary metal-oxide-semiconductor (CMOS) devices, and more particularly to a method of fabricating a CMOS device having high dielectric constant (high-k) dielectric layer and metal gate electrode.

2. Description of the Related Art

With the continuous miniaturization of the dimensions of CMOS devices, traditional device film layers also encounter many challenges, new device materials for the development of very large scale integration (VLSI) will be an issue urgently needed to be resolved in the next few years. In recent years, the development of high-k dielectric layer and metal gate electrode has become one of the important researches in the semiconductor industry.

FIGS. 1A-1E are schematic sectional views illustrating a conventional method of fabricating a CMOS device including high-k dielectric layer and metal gate electrode.

First, referring to FIG. 1A, a semiconductor substrate 100 having a plurality of shallow trench isolation (STI) structures 102 formed therein defining an N-type MOS region 104 and a P-type MOS region 106 is provided. A silicon oxide layer 108 and a hafnium oxide (HfO2) layer 110 are sequentially formed over the substrate 100. The hafnium oxide layer 110 is comprised of a high-k dielectric material layer, the silicon oxide layer 108 serves as an interfacial layer (IL) between the substrate 100 and the hafnium oxide layer 110.

Subsequently, referring to FIG. 1B, a lanthanum oxide (LaO) layer 112 and an aluminum oxide (AlO) layer 114 are respectively formed over a portion of the hafnium oxide layer 110 at the N-type MOS region 104 and another portion of the hafnium oxide layer 110 at the P-type MOS region 106, for adjusting work functions of respective metal gate electrode.

Afterwards, referring to FIG. 1C, multiple gate stacked structures 116 are formed over the substrate 100 and respectively cover a part of the lanthanum oxide layer 112 and a part of the aluminum oxide layer 114. Each of the gate stacked structures 116 is comprised of a titanium nitride layer 118, a poly-silicon layer 120 and a hard mask layer 122 in an order from bottom to top.

Next, two wet etching steps are performed to form gate dielectric layers of the MOS devices.

Referring to FIG. 1D, a wet etching step 124 is performed; so that portions of the aluminum oxide layer 114 and the lanthanum oxide layer 112 uncovered by the gate stacked structures 116 are removed and thereby formed a patterned aluminum oxide layer 114a and a patterned lanthanum oxide layer 112a. The wet etching step 124 sequentially includes: loading the CMOS device into an etching machine, using a diluted hydrochloric acid (HCl) as etching solution, etching both the aluminum oxide layer 114 and the lanthanum oxide layer 112, cleaning device surfaces by using distilled water to remove residual etching solution, blow drying the device, and removing the device out from the etching machine.

After that, referring to FIG. 1E, another wet etching step 126 is performed, so that portions of the hafnium oxide layer 110 and the silicon oxide layer 108 uncovered by the gate stacked structures 116 are removed and thereby form a patterned hafnium oxide layer 110a and a patterned silicon oxide layer 108a. The wet etching step 126 sequentially includes: loading the CMOS device into the etching machine, using a diluted hydrofluoric acid (HF) as etching solution, etching the hafnium oxide layer 110 and the silicon oxide layer 108, cleaning device surfaces by using a distilled water to remove residual etching solution, blow drying the device, and removing the device out from the etching machine. Thus, the fabrication of the gate dielectric layers for the MOS devices is completed.

However, in the conventional method of fabricating the CMOS device, after etching the aluminum oxide layer 114, the lanthanum oxide layer 112, the hafnium oxide layer 110 and the silicon oxide layer 108, the polymers or other residues adhere on to the surface of the device, which would adversely influence the subsequent fabrication process and lead to poor yield and degrade the device performance.

Therefore, how to improve the above-mentioned issues and integrate the high-k dielectric layer and the metal gate electrode into a high yield and reliability of CMOS fabrication process will be one of important topics for the development of semiconductor device.

BRIEF SUMMARY

Accordingly, the present invention relates to a method for fabricating a CMOS device that may reduce the possibility of polymers or other residues from adhering to the surface of the device to cause degrade the device performance and poor yield.

A method of fabricating a CMOS device in accordance with an embodiment is provided. First, an isolation structure is formed in a substrate to define a first-type MOS region and a second-type MOS region. Next, an interfacial layer and a high-k dielectric layer are sequentially formed on the substrate. Next, a first cover layer and a second cover layer are respectively over a portion of the high-k dielectric layer at the first-type MOS region and another portion of the high-k dielectric layer at the second-type MOS region. Afterwards, a first gate stacked structure and a second gate stacked structure respectively are formed over a part of the first cover layer and a part of the second cover layer, wherein the first gate stacked structure and the second gate stacked structure include, in a bottom-to-top-order, a first conductive layer, a second conductive layer and a hard mask layer. Next, an in-situ wet etching step is performed using a first etching solution to etch the first and second cover layers and a second etching solution to etch both the high-k dielectric layer and the interfacial layer until the substrate is exposed, wherein the second etching solution is a mixed etching solution containing the first etching solution.

In one embodiment, the high-k dielectric layer is, for example, a hafnium-containing dielectric layer. Preferably, the high-k dielectric layer is, for example, a hafnium oxide layer.

In one embodiment, the first cover layer and the second cover layer are, for example high-k material layers. Preferably, the first-type MOS region is an N-type MOS region, the second-type MOS region is a P-type MOS region, the first cover layer is, for example a lanthanum oxide layer, and the second cover layer is, for example an aluminum oxide layer.

In one embodiment, the first etching solution is a diluted hydrochloric acid; the second etching solution is a mixed etching solution containing a diluted hydrochloric acid and a diluted hydrofluoric acid. In another embodiment, after using the second etching solution, a third etching solution is used; whose composition is the same as the first etching solution.

In one embodiment, the first conductive layer is, for example a metal layer. Preferably, a material of the first conductive layer is one selected from the group consisting of tungsten, aluminum, aluminum copper alloys, copper, titanium, titanium silicide, cobalt, cobalt silicide, nickel, nickel silicide, titanium nitride, titanium tungsten alloys and tantalum nitride.

In one embodiment, the second conductive layer is, for example a poly-silicon layer.

In one embodiment, the interfacial layer is, for example a silicon oxide layer.

In one embodiment, the method further includes performing a plasma treatment step before performing the in-situ wet etching step. A gas used in the plasma treatment step includes argon and/or boron trichloride.

In the above-mentioned embodiments of the present invention, since the present method employs the in-situ method and performs the wet etching step to the dielectric layer without removing the device out of the etching machine, and therefore it not only can be readily integrated with general CMOS fabrication process, but also can make the fabrication process much more simple and convenient. Moreover, the method may directly replace the etching solution and then use the mixed etching solution to etch the dielectric layer in the same etching machine, and therefore it may not only increase the etching efficiency and avoid polymers or other residues from adhering to device surfaces, but also may improve the subsequent manufacturing process and the issues associated with the degradation of device performance and yield. In addition, before performing the in-situ wet etching step, a plasma treatment step to a device surface can be performed for facilitating the subsequent wet etching step.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 3 is a schematic flow chart of an in-situ wet etching step in accordance with an embodiment of the present invention.

DETAILED DESCRIPTION

FIGS. 2A-2E are schematic sectional views illustrating a method of fabricating a CMOS device having high-k dielectric layer and metal gate electrode, in accordance with an embodiment of the present invention.

Figure 1A:
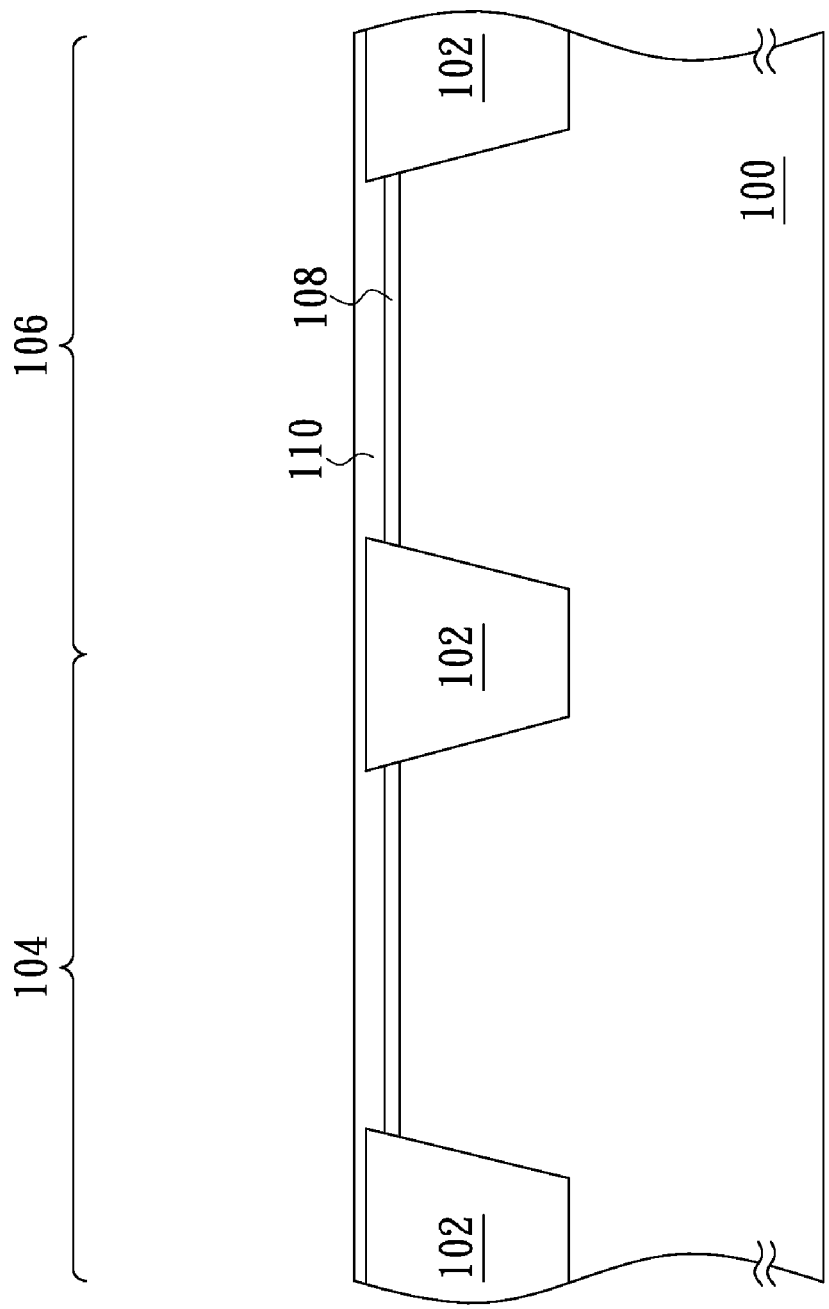
FIGS. 1A-1E are schematic sectional views illustrating a conventional method of fabricating a CMOS device having high-k dielectric layer and metal gate electrode.
Figure 1B:
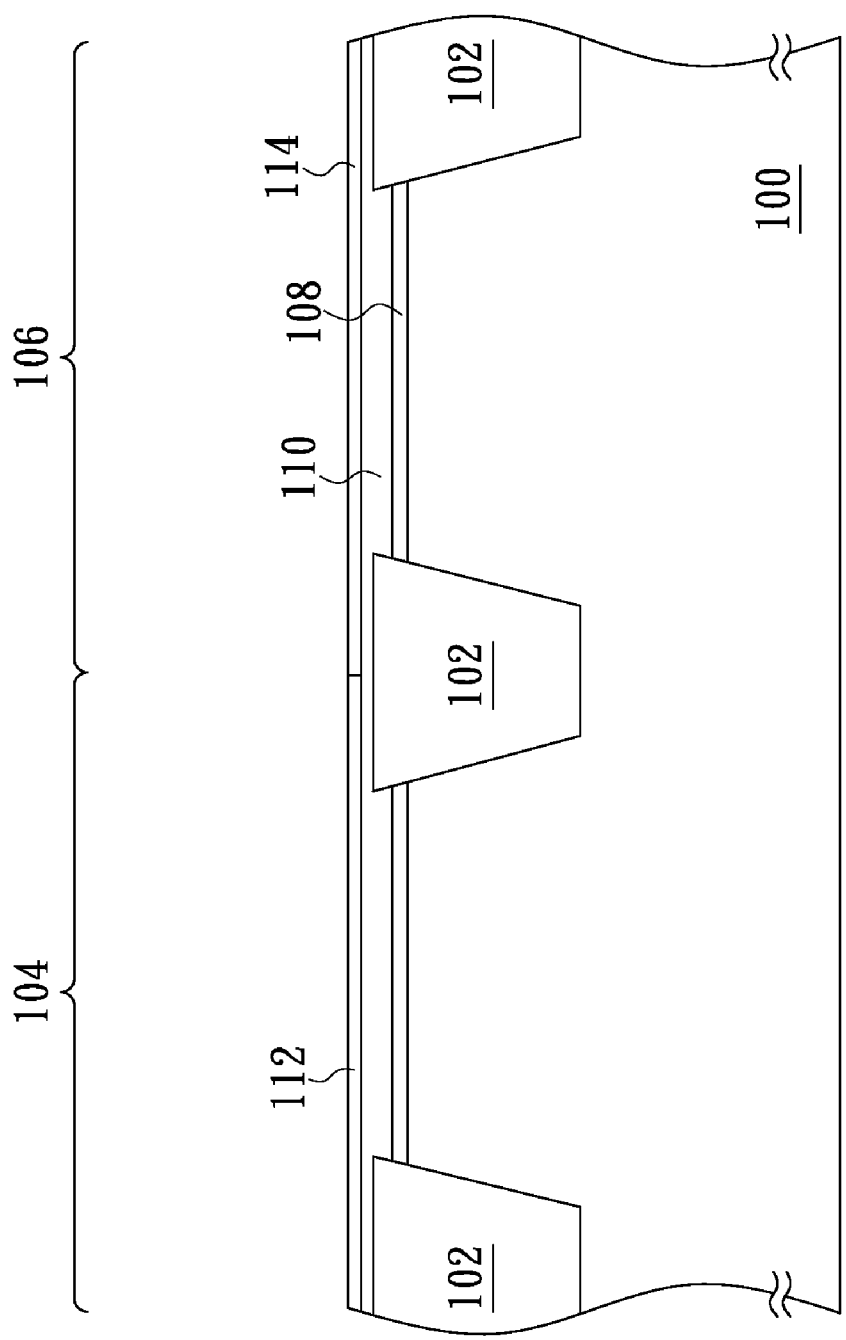
Figure 1C:
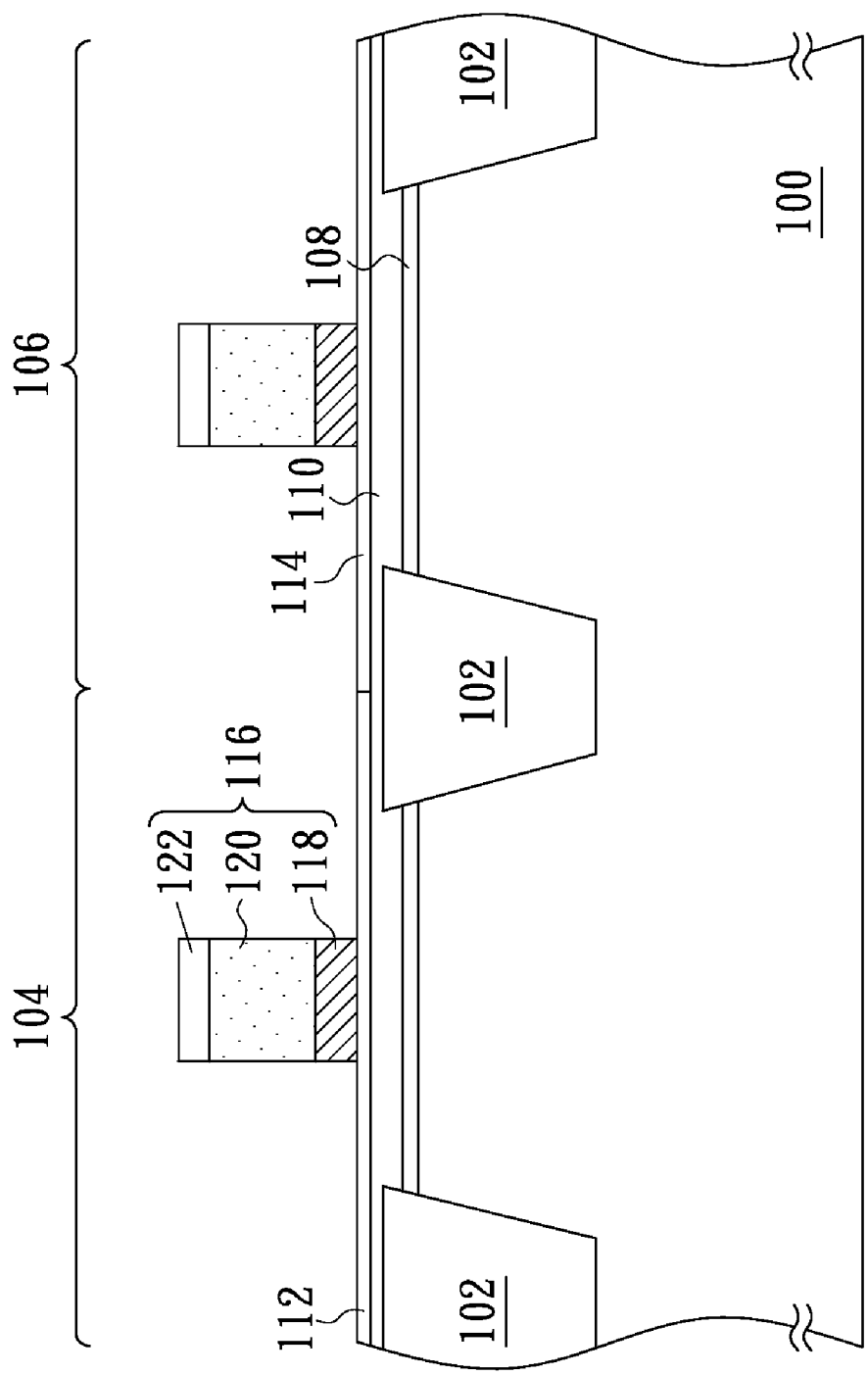
Figure 1D:
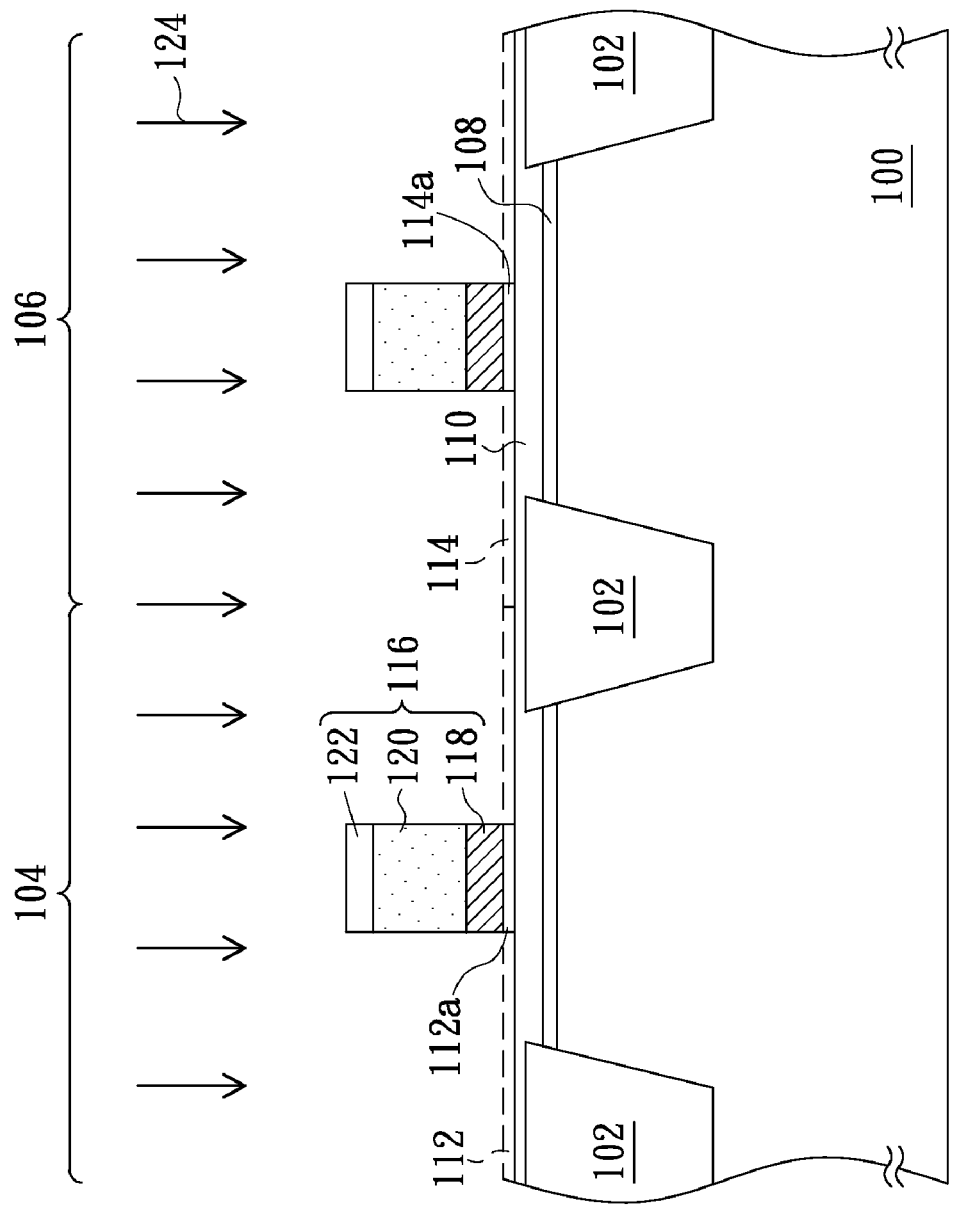
Figure 1E:
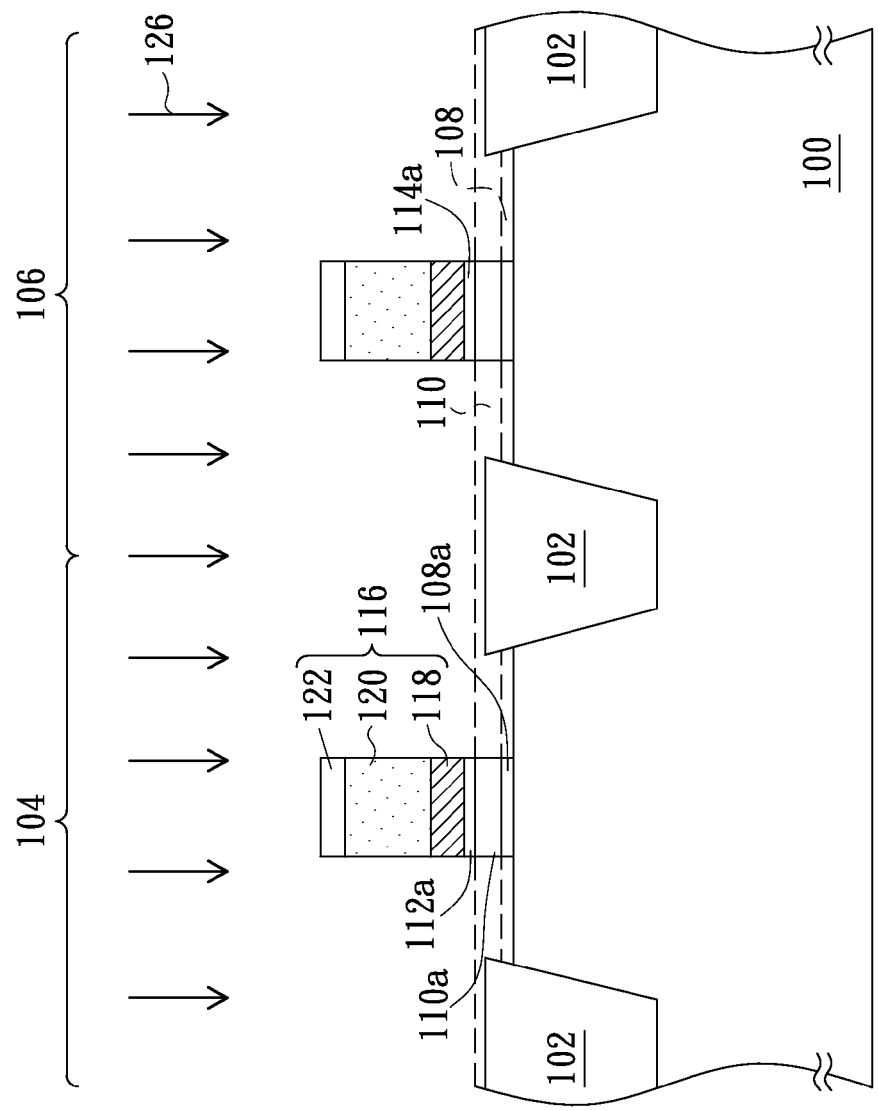
Figure 2A:
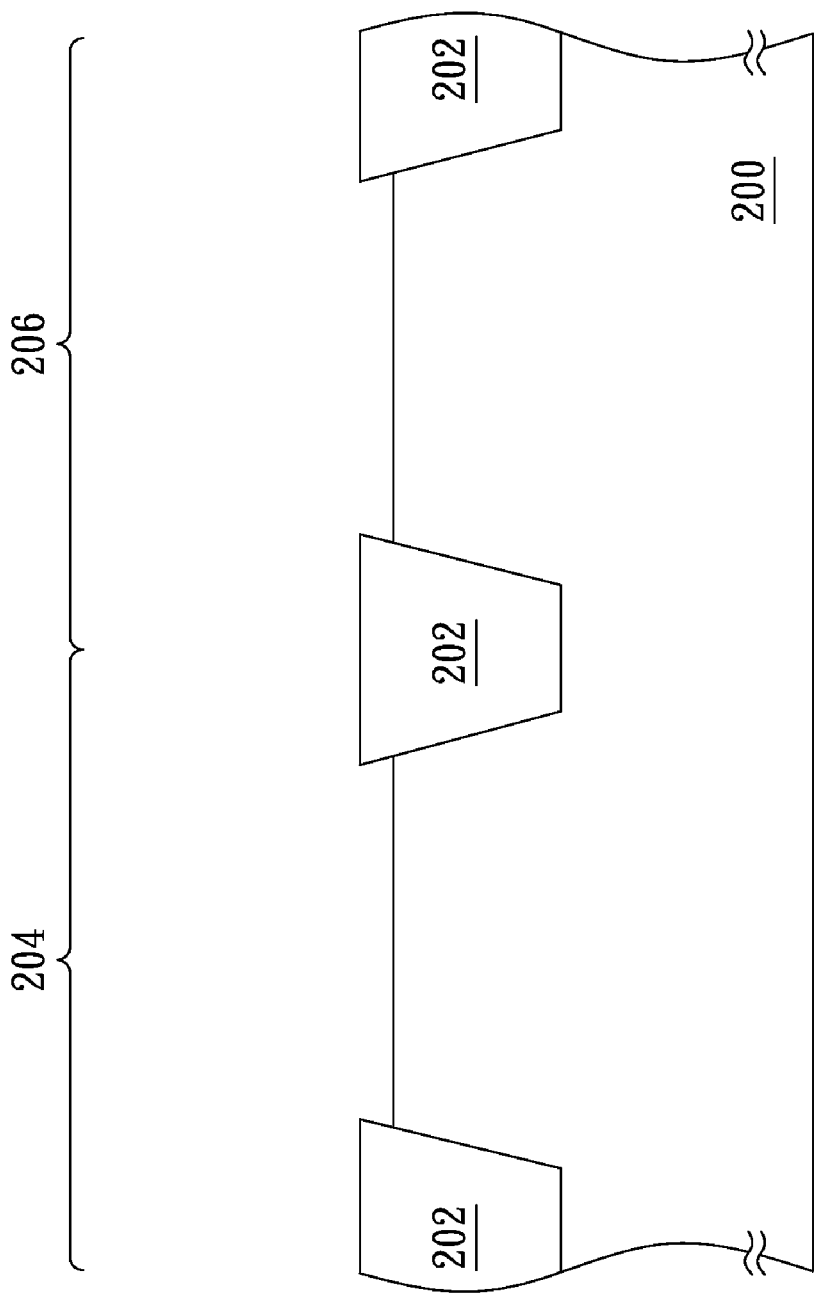
FIGS. 2A-2E are schematic sectional views illustrating a method of fabricating a CMOS device having high-k dielectric layer and metal gate electrode, in accordance with an embodiment of the present invention.

First, referring to FIG. 2A, a substrate 200, for example, a semiconductor substrate, is provided. Multiple isolation structures 202 are formed in the substrate 200 to define a first-type MOS region 204 and a second-type MOS region 206. The isolation structures 202 are, for example, shallow trench isolation (STI) structures. In the illustrated embodiment, the first-type MOS region 204 is, for example, an N-type MOS region, and the second-type MOS region 206 is, for example, a P-type MOS region.

Figure 2B:
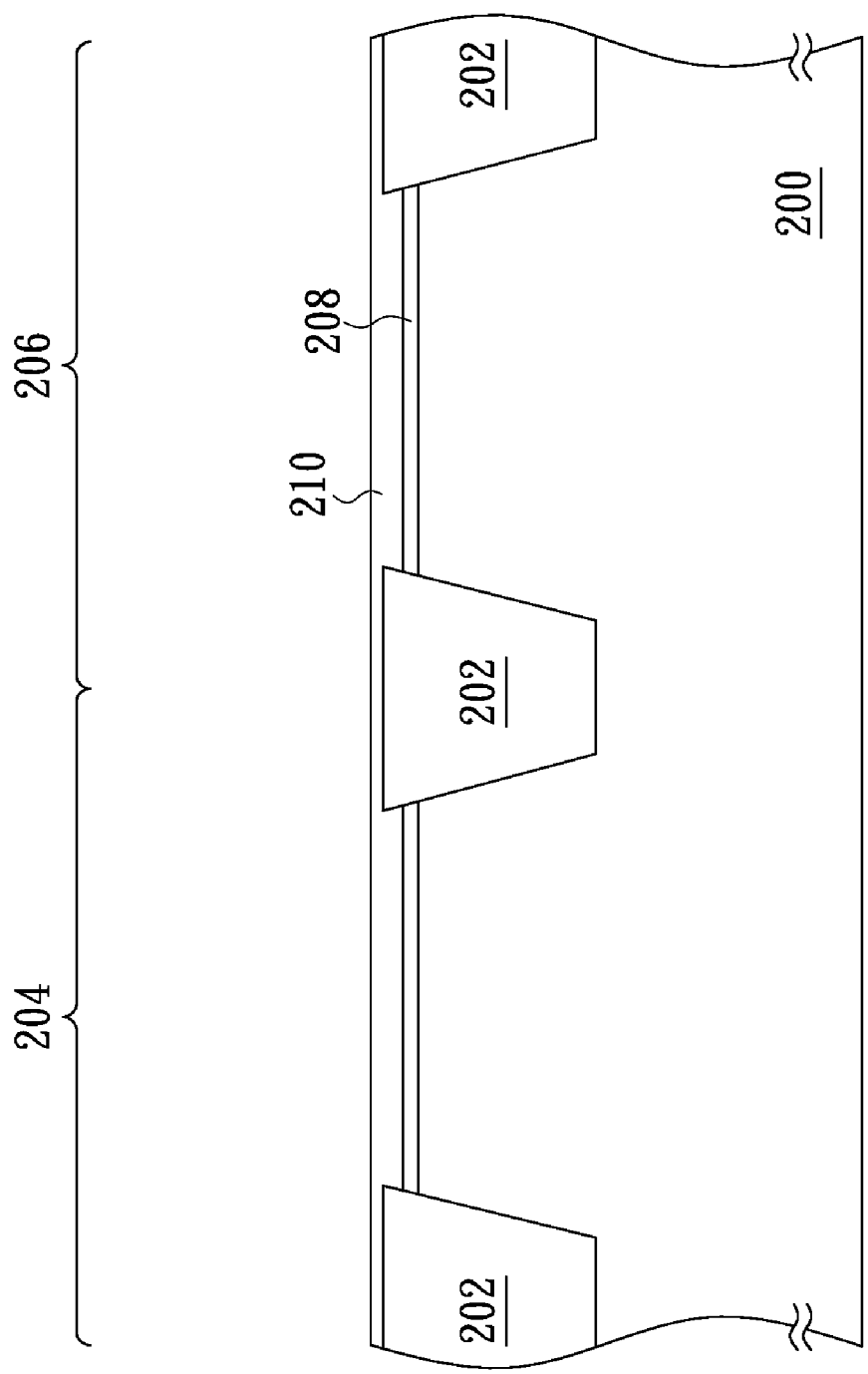

Referring to FIG. 2B, an interfacial layer (IL) 208 is formed over the substrate 200. The interfacial layer 208 is, for example, a silicon oxide layer. The process for forming the interfacial layer 208 includes, for example, a chemical vapor deposition process; a plasma enhanced chemical vapor deposition process or rapid thermal process. Subsequently, a high-k dielectric layer 210 is formed over the interfacial layer 208. The high-k dielectric layer 210 comprises, for example, a hafnium-containing dielectric layer. Preferably, the high-k dielectric layer 210 includes, for example, a hafnium oxide layer. The process for forming the high-k dielectric layer 210 includes, for example, a deposition process or a sputtering process. The interfacial layer 208 may be used for promoting adhesion between the high-k dielectric layer 210 and the substrate 200.

Figure 2C:
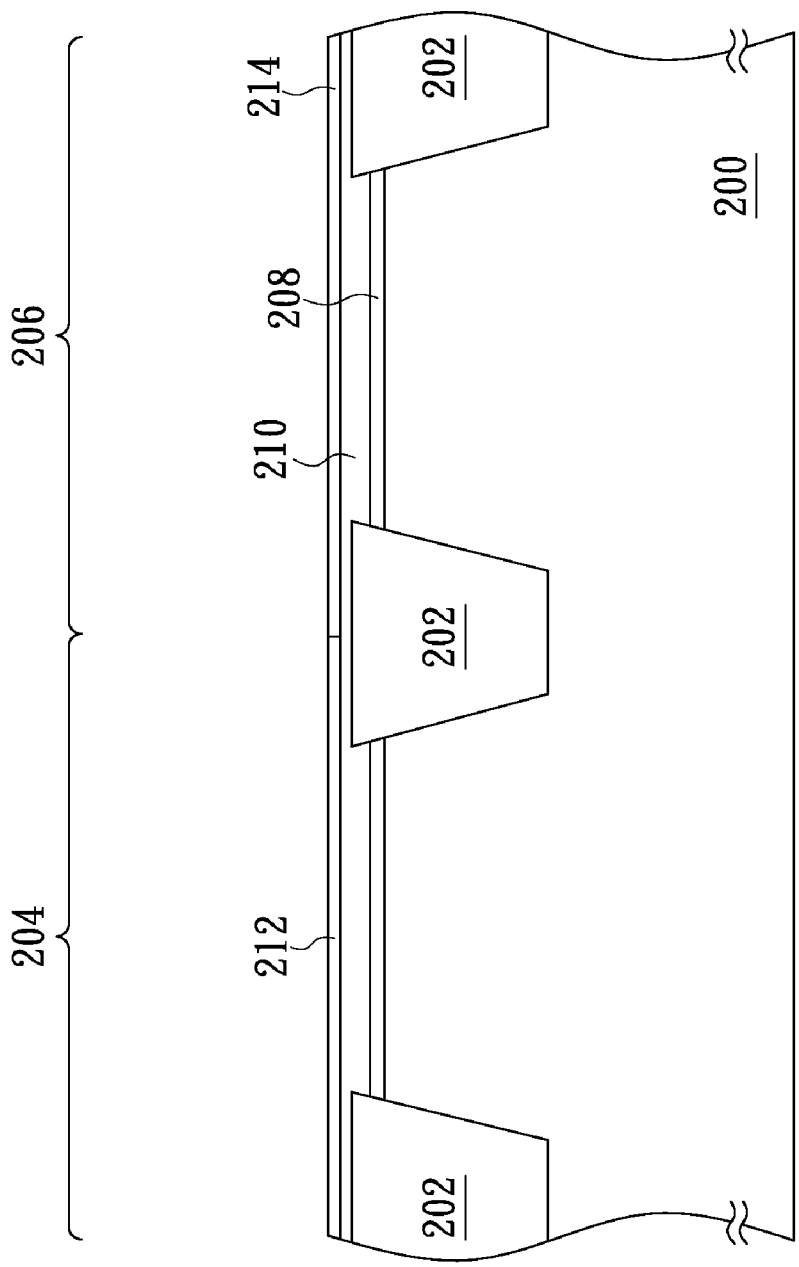

Referring to FIG. 2C, a first cover layer 212 and a second cover layer 214 are respectively formed over a portion of the high-k dielectric layer 210 at the first-type MOS region 204 and another portion of the high-k dielectric layer 210 at the second-type MOS region 206. The first cover layer 212 and the second cover layer 214 are used for adjusting work functions of respective metal gate electrodes. The first cover layer 212 and the second cover layer 214 are for example high-k material layers. Preferably, the first cover layer 212 includes, for example, a lanthanum oxide (LaO) layer, and the second cover layer 214 includes, for example, an aluminum oxide (AlO) layer.

The process for forming the first cover layer 212 and the second cover layer 214 includes, for example: first depositing a first cover material layer (not shown) covering the entire high-k dielectric layer 210, forming a masking layer (not shown) over the portion of the first cover material layer at the first-type MOS region 204, etching the first cover material layer using the masking layer as etching mask to form the first cover layer 212, and removing the masking layer at the first-type MOS region 204; depositing a second cover material layer (not shown) to cover the portion of the high-k dielectric layer 210 at the second-type MOS region 206 and the first cover layer 212, forming a masking layer (not shown) on a portion of the second cover material layer at the second-type MOS region 206, etching the second cover material layer using the masking layer as etching mask to form the second cover layer 214, and removing the masking layer at the second-type MOS region 206.

Figure 2D:
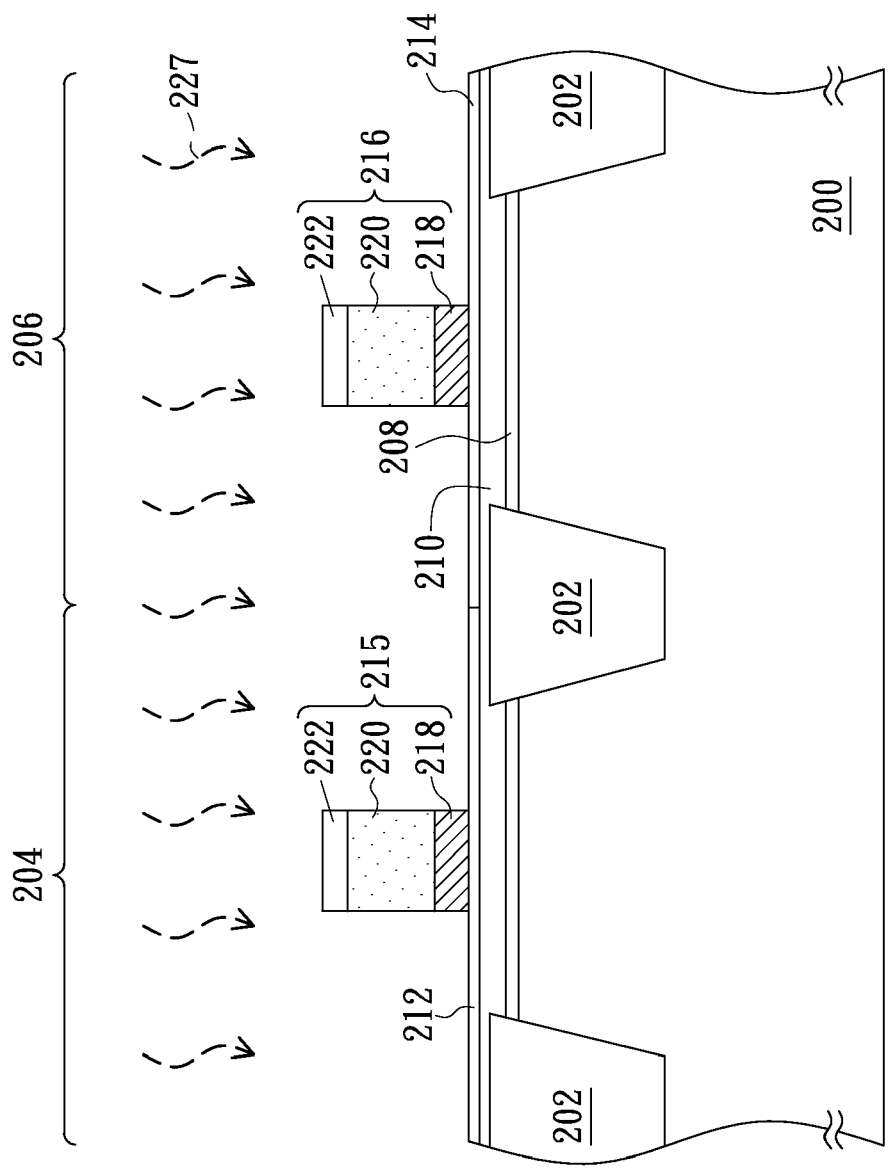

Referring to FIG. 2D, a first gate stacked structure 215 and a second gate stacked structure 216 are respectively formed on a part of the first cover layer 212 and a part of the second cover layer 214. The first gate stacked structure 215 and the second gate stacked structure 216 each are comprised of, in an order from bottom-to-top from the substrate 200, a first conductive layer 218, a second conductive layer 220 and a hard mask layer 222. The first conductive layer 218 includes, for example a metal layer, and a material of the metal layer includes, for example, one selected from the group consisting of tungsten, aluminum, aluminum copper alloys, copper, titanium, titanium silicide, cobalt, cobalt silicide, nickel, nickel silicide, titanium nitride, titanium tungsten alloys and tantalum nitride. Preferably, the first conductive layer 218 includes, for example, a titanium nitride layer. In addition, the second conductive layer 220 includes, for example a poly-silicon layer. The hard mask layer 222 includes, for example a silicon nitride layer.

The process for forming the first gate stacked structure 215 and the second gate stacked structure 216 includes, for example: sequentially depositing a first conductive material layer (not shown), a second conductive material layer (not shown) and a hard mask material layer (not shown) over the first cover layer 212 and the second cover layer 214, forming a patterned photo-resist layer (not shown) over the hard mask material layer, etching the hard mask material layer using the patterned photo-resist layer as etching mask to form the hard mask layer 222, removing the patterned photo-resist layer, etching the second conductive material layer and the first conductive material layer using the hard mask layer 222 as etching mask to form the second conductive layer 220 and the first conductive layer 218. As a result, the first gate stacked structure 215 and the second gate stacked structure 216 over the first-type MOS region 204 and the second-type MOS region 206 are respectively formed.

Continuing to refer to FIGS. 2E and 3, an etching process for etching the gate dielectric layers of the CMOS device may be described below in detailed. FIG. 3 is a flow chart of an in-situ wet etching step according to an embodiment.

Figure 2E:
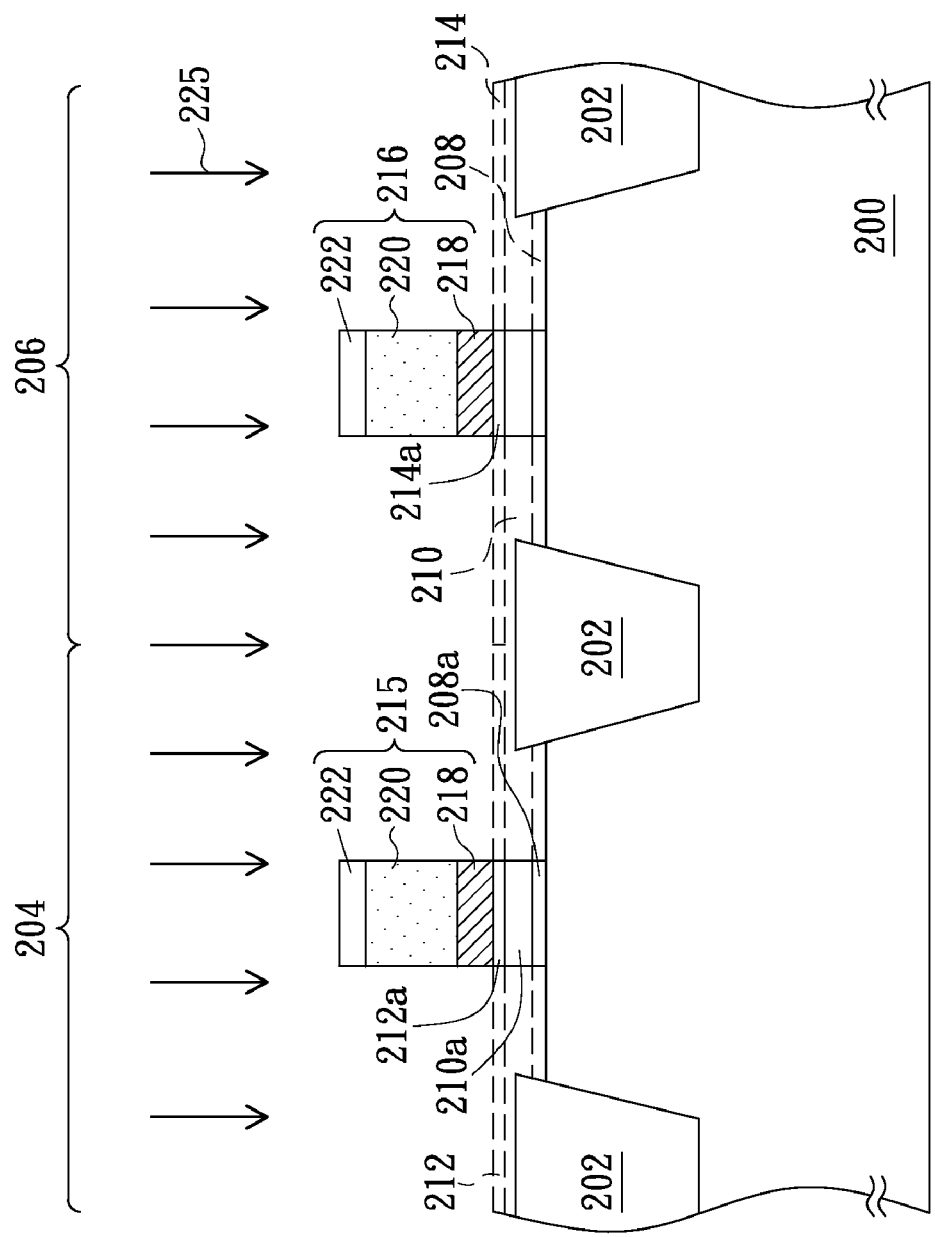

As illustrated in FIG. 2E, in an etching machine, a wet etching step 225 is performed. In particular, the first cover layer 212 and the second cover layer 214 are first etched; the high-k dielectric layer 210 and the interfacial layer 208 are etched then until the substrate 200 is exposed such that the device is not removed out of the etching machine. As a result, a first cover layer 212a, a second cover layer 214a, high-k dielectric layers 210a and interfacial layers 108a are formed as the gate dielectric layers.

More specifically, as illustrated in FIG. 3, the wet etching step 225 includes: in the same etching machine, at step 310, a first etching solution is used to remove the portions of the first cover layer 212 and the second cover layer 214 respectively not covered by the first gate stacked structure 215 and the second gate stacked structure 216. Next, at step 320, the device surfaces is cleaned by using a distilled water to remove residual etching solution. Next, at step 330, a second etching solution (is used to remove exposed portions of both the high-k dielectric layer 210 and the interfacial layer 208. Next, at step 340, the device surfaces are cleaned by using a distilled water to remove residual etching solution. Next, at step 350, the device is blow dried. Next, the device is removed out of the etching machine to complete the etching step. In the illustrated embodiment, the first etching solution includes, for example, a diluted hydrochloric acid; the second etching solution includes a mixed etching solution containing the first etching solution, for example, the second etching solution includes a mixture of a diluted hydrochloric acid and a diluted hydrofluoric acid.

Particularly, in the step of etching the dielectric layers (i.e., the cover layers, the high-k dielectric layer and the interfacial layer), unused portions of the dielectric layers can be completely removed by using a mixed etching solution in-situ, therefore the issues associated with the subsequent fabrication process causing degradation of device performance and poor yield due to the polymers or other residues adhering to the device surfaces as described in the prior art may be effectively avoided.

Moreover, compared with the conventional fabrication process which requires loading/unloading of the device into/out of etching machines many times, during the fabrication thereof may be avoided by the process proposed by the present invention, and therefore, the fabrication process may be simplified and can also be easily integrated into the general CMOS device fabrication process.

Figure 4B:
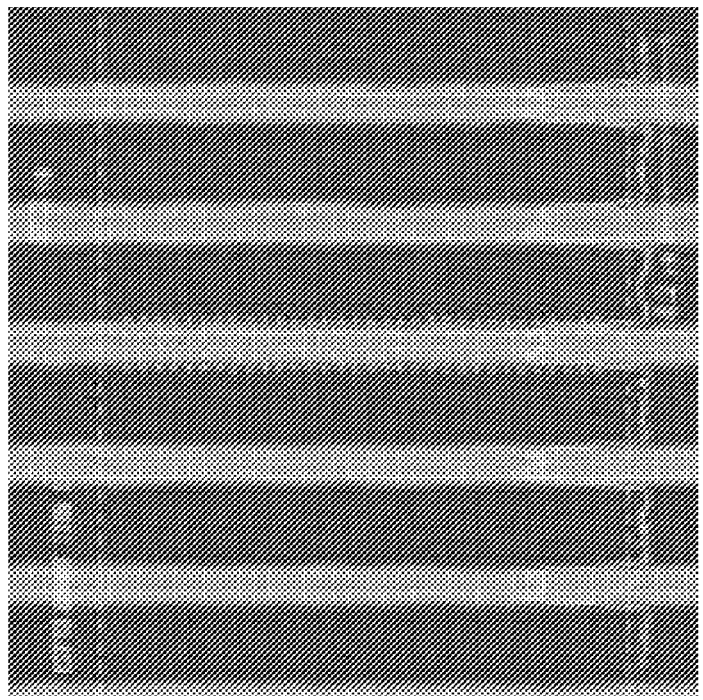
FIGS. 4A and 4B are scanning electron microscope (SEM) images of a device manufactured by a method in accordance with the embodiment of the present invention.
Figure 4A:
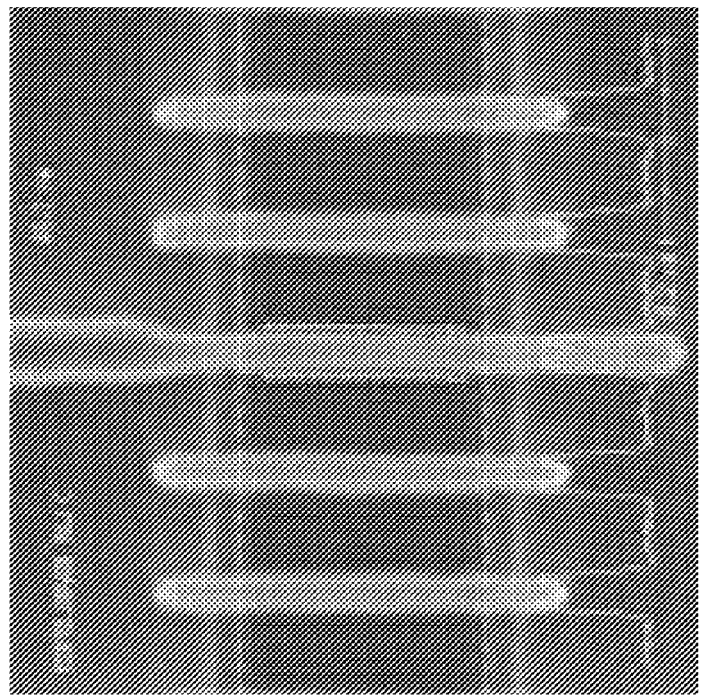

As illustrated in FIGS. 4A and 4B, scanning electron microscope (SEM) images of a device fabricated by the process proposed by the present invention are illustrated. It is found from the SEM images that the device surfaces have no polymer or other residues adhered thereto after the device is being etched.

It is noted that, in one embodiment, in the above-mentioned wet etching step 225, after using the second etching solution, optionally a third etching solution may be applied on the device without removing it out of the etching machine, so as to further clean or increase the etching efficiency of the dielectric layers of the device and reduce the possible adhesion of the polymers or other residues. The third etching solution may be the same as the first etching solution, and may be comprised of, for example, a diluted hydrochloric acid. That is, as illustrated in FIG. 3, after the cleaning (as illustrated by the reference 340) using the distilled water and before the blow drying step (as illustrated by the reference 350), the third etching solution may be applied (as illustrated by the reference 360) and then a distilled water may be used to perform a cleaning step (as illustrated by the reference 370).

In another embodiment, referring to FIG. 2D again, before performing the wet etching step 225, a plasma treatment step 227 may be performed so as to promote the performance of the subsequent etching step. The plasma treatment step 227 may include, for example, an argon (Ar) gas source to make the structures of the first cover layer 212 and the second cover layer 214 relatively loose and thereby increase the etching velocity for the high-k dielectric layer 210. The plasma treatment step 227 may include, for example, boron chloride (BCl3) gas source. Additionally, the plasma treatment step 227 may include, for example, an argon and boron trichloride gas source.

It is understood that, after performing the etching step to the dielectric layers of gates, other processes of forming the source electrodes and drain electrodes and the removal of the hard mask layer 222, etc. can be performed. Such processes and the subsequent process for completing the COMS device ought to be well-known to the skilled person in the art, and thus will not be repeated herein.

In summary, the method of fabricating a CMOS device includes an in-situ wet etching step such that the wet etching step is performed within the etching machine without removing the device out of the etching machine to replace the conventional two wet etching steps for etching of the dielectric layers (i.e., the cover layers, the high-k dielectric layer and interfacial layer). The method of the present invention may not only be integrated into the general CMOS device fabrication process, but also may make the fabrication process relatively simple and convenient.

Moreover, the method of the present invention may directly replace the etching solution after etching the cover layers and use the mixed etching solution to etch both the high-k dielectric layer and the interfacial layer in the same etching machine, which would not only increase the etching efficiency and avoid polymers or other residues adhering to the device surfaces, but also may improve the subsequent fabrication process and reduce the possible degradation of device performance and yield.

In addition, before performing the in-situ wet etching step, a plasma treatment step may be applied to a device surface, which may promote the subsequent etching step.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of fabricating a MOS device, comprising:
sequentially forming an interfacial layer, a high-k dielectric layer and a cover layer on a substrate; and
performing an in-situ wet etching step by sequentially using a first etching solution to etch the cover layer and using a second etching solution to etch the high-k dielectric layer and the interfacial layer until the substrate is exposed, wherein the second etching solution is a mixed etching solution containing the first etching solution.

2. The method as claimed in claim 1, wherein the high-k dielectric layer comprises a hafnium-containing dielectric layer.

3. The method as claimed in claim 2, wherein the high-k dielectric layer comprises a hafnium oxide layer.

4. The method as claimed in claim 1, wherein the cover layer comprises a lanthanum oxide layer or an aluminum oxide layer.

5. The method as claimed in claim 1, wherein the first etching solution includes a diluted hydrochloric acid.

6. The method as claimed in claim 5, wherein the second etching solution includes a mixed etching solution containing a diluted hydrochloric acid and a diluted hydrofluoric acid.

7. The method as claimed in claim 1, further comprising using a third etching solution after using the second etching solution.

8. The method as claimed in claim 7, wherein the third etching solution is the same as the first etching solution.

9. The method as claimed in claim 1, wherein the interfacial layer comprises a silicon oxide layer.

10. The method as claimed in claim 1, further comprising a step of performing a plasma treatment before performing the in-situ wet etching step.

11. The method as claimed in claim 10, wherein a gas used in the plasma treatment step comprises argon and/or boron trichloride.

12. A method of fabricating a MOS device, comprising:
sequentially forming an interfacial layer, a high-k dielectric layer and a patterned mask on a substrate; and
performing an in-situ wet etching step by sequentially using an etching solution to etch the high-k dielectric layer and the interfacial layer until the substrate is exposed and an other etching solution, wherein the etching solution is a mixed etching solution containing the other etching solution.

13. The method as claimed in claim 12, wherein the high-k dielectric layer comprises a hafnium-containing dielectric layer.

14. The method as claimed in claim 13, wherein the high-k dielectric layer comprises a hafnium oxide layer.

15. The method as claimed in claim 12, wherein the other etching solution includes a diluted hydrochloric acid.

16. The method as claimed in claim 15, wherein the etching solution includes a mixed etching solution containing a diluted hydrochloric acid and a diluted hydrofluoric acid.

17. The method as claimed in claim 12, wherein the interfacial layer comprises a silicon oxide layer.

18. A method of fabricating a MOS device, comprising:
sequentially forming an interfacial layer, a high-k dielectric layer and a patterned mask on a substrate; and
performing an in-situ wet etching step by using an etching solution to etch the high-k dielectric layer and the interfacial layer until the substrate is exposed.

19. The method as claimed in claim 18, wherein the high-k dielectric layer comprises a hafnium-containing dielectric layer.

20. The method as claimed in claim 18, wherein the etching solution includes a mixed etching solution containing a diluted hydrochloric acid and a diluted hydrofluoric acid.

* * * * *